United States Patent [19]

Delorme

[11] 4,203,789

[45] May 20, 1980

[54] PROCESS FOR REPRODUCING PICTORIAL WORKS AND WORKS ACHIEVED WITH SAID PROCESS

[76] Inventor: Gérard L. Y. Delorme, 10 boulevard Suchet, Paris, France

[21] Appl. No.: 836,845

[22] Filed: Sep. 26, 1977

[51] Int. Cl.² .......................... B44C 3/00; G03C 5/04; G03C 5/00

[52] U.S. Cl. ....................................... 156/59; 427/258; 427/260; 427/262; 427/265; 427/280; 428/15; 430/320; 430/324; 430/494; 355/77

[58] Field of Search .................... 96/2, 27 R, 38.1, 46, 96/28, 38.2, 40; 427/271, 277, 264, 270, 258, 260, 262, 265, 280; 35/26; 456/59; 428/15

[56] References Cited

U.S. PATENT DOCUMENTS

| | | | |
|---|---|---|---|
| 332,364 | 0/1885 | Sherman | 96/36 |
| 607,147 | 7/1898 | Waide | 156/59 |
| 1,604,319 | 10/1926 | Rozgonyi | 156/59 |
| 1,651,136 | 11/1927 | Lang | 96/27 R |
| 1,888,344 | 11/1932 | Bon | 96/2 X |
| 2,244,905 | 6/1941 | Crawford | 96/28 |
| 2,656,634 | 10/1953 | Varner | 156/59 |
| 3,744,152 | 6/1973 | Crasilneck | 35/26 |
| 3,772,106 | 11/1973 | Giorgi | 156/59 X |
| 3,856,592 | 12/1974 | Giorgi | 156/59 |
| 4,001,062 | 1/1977 | Iisaka | 156/59 |

OTHER PUBLICATIONS

"Focal Encyclopedia of Photography", Aug. 1967, pp. 1580–1586.

*Primary Examiner*—Edward C. Kimlin
*Attorney, Agent, or Firm*—Hubbard, Thurman, Turner, Tucker & Glaser

[57] ABSTRACT

The invention provides a process for reproducing pictorial works, in particular paintings, on a canvas, wood or the like support, by taking a photograph or a flat copy of the original painting, a process wherein said support is prepared by making relief portions therein which correspond to the relief portions of the original painting to be reproduced, and said photograph or flat copy are applied on to said relief support thus prepared.

12 Claims, No Drawings

PROCESS FOR REPRODUCING PICTORIAL WORKS AND WORKS ACHIEVED WITH SAID PROCESS

The present invention provides a process for reproducing pictorial works, as well as the reproductions achieved through said process.

Various processes for reproducing paintings are already known, ranging from extremely simple processes consisting in taking a photograph of the work, in making an enlargement of the original work to the size thereof and in sticking said photograph on to a support such as a canvas.

More elaborated processes consist in analysing the painting in function of the colors thereof and in making stencils, then in resetting the original painting by means of said stencils.

This last process shows the drawback of not being suitable to all paintings, because said process would be too onerous in view of the great number of stencils to be achieved, of the size of the painting, and so forth.

The first process of reproduction referred to hereabove, consisting in re-mounting a photograph of the work to the accurate size thereof on to a canvas to leave the relief of the threads of said canvas show through, is a process suitable only for a very limited number of works, in particular ancient ones, wherein the canvas is effectively shown through the paint. However, such a type of painting is rather scarce and most of paintings on canvas are perfectly glossy or crackled, or have paint reliefs, but do not leave the threads of the canvas properly speaking show through.

The present invention is aimed to provide a process making it possible to reproduce paintings through a photograph or flat copy means although providing paintings with a relief very close to that of the original painting. To this end, the invention provides a process wherein a support is prepared by making therein relief portions corresponding to the relief portions of the original painting and the photograph or flat copy are then applied on to the support thus prepared.

The process provided by the invention consists in combining a color photograph or flat copy of the original painting with a support corresponding to that of said original painting, for example a canvas or a panel, in processing said support to give it a relief imitating that of the original painting, then in combining said support with said photograph or flat copy.

The expression "flat copy" refers for example to a color printing of the original painting (for example from 3 to 10 colors). The selection of a photograph or a printed copy or the like depends on the print to be achieved.

By way of example, where limited prints are sought, photograph is particularly suitable, while for performing a great number of prints, printing processes seem to be more suitable, particularly in view of their costing price.

With more details, after having taken a photograph of the original painting and enlarged said photograph to the size of said original painting, said photograph is processed so as to remove the colored gelatine from its support.

The process of transfer on to the transparent sheet can also be applied to copies obtained through printing.

To this end, a mat or glossy transparent pellicle is applied on to the photograph or flat copy. Then, this assembly is pressed while heated. The operations such as the pressure, the temperature, and so forth, are performed depending on the materials used, such requirements being known from experts: thus, some types of materials are stuck when heated under pressure, while others can be stuck or fixed when cold.

When the compression under heat has been performed, the transparent sheet of the photograph is removed by dividing the layer of colored gelatin or that of colors which are thus transferred from the cardboard or paper of said photograph on to the transparent sheet. The latter is thus ready to be fixed on to the new support.

So as to prepare the reproduction support, a material identical to that of the original painting is selected, generally a canvas. One or more layers of the preparation are applied on to said canvas although, depending on the case, the canvas can be used such as.

Then, reliefs imitating those of the original painting are made on said canvas. To this end, a picture of the original painting (or of a photograph of said original painting) to the size selected for the reproduction is projected on to said canvas.

Masses of a material likely to harden, such as for example a preparation, plaster, and so forth, are applied on to said canvas.

Said masses of material are distributed and shaped so as to imitate the reliefs of the paint of the original painting. In order to determine the areas to be thus put in relief, it suffices to consider the original painting, the photograph thereof or to take very simple rules into account; as a matter of fact, the examination of a standard painting, or more genreally figurative, shows that in general the shadow areas are relatively glossy and the enlightened areas pasty, in particular white colors; the same applies to pleats in garments, and so forth.

When the support thus made is dried, a sheet whose two surfaces are adhesive is placed on to said support, then the transparent sheet carrying the photographic gelatin is positioned thereon. Such a positioning must be performed with a great precision so as to ensure an entire coincidence between the relief of the support and the photograph or the flat copy. Thermic or mechanic phenomena may occur such as, for example, expansion, contraction phenomena, and so forth which will be taken into account in practice.

However, said two adhesive surfaces sheet can be replaced by any other fixing means such as an adhesive coating, a glue, and so forth.

When positioning is performed, this assembly is compressed while it is heated so as to make the elements thus combined integral with each other.

Further to this operation, a surface processing can be contemplated so as to generate a more or less bright area.

The reproduction obtained through the process disclosed hereabove is more faithful in relation to the original painting in view of the relief which creats light effects and breaks the uniformity of the surface.

Of course, the invention is not limited to the mode of embodiment disclosed and depicted hereabove, from which other forms and modes of embodiment can be provided without thereby departing from the scope of the invention.

I claim:

1. A process for reproducing a pictorial work such as a painting on a support comprising:
   producing a flat copy of said pictorial work;

projecting an image of saif flat copy onto the support;

applying touches of a hardenable pasty mass to portions of said support to construct imitation relief portions coinciding with relief portions of the pictorial work shown in said image;

allowing the touches of pasty mass to harden on said support; and applying said flat copy to the support so that the relief portions of the pictorial work shown in the flat copy coincide with the imitation relief portions on the support.

2. The process of claim 1 wherein said flat copy is produced by taking a photograph of said pictorial work, removing a portion of said photograph comprising a thin image-bearing film from the photograph support, and transferring said film onto a transparent sheet.

3. The process of claim 2 wherein the film is applied to the support by first applying an adhesive substance to the support and then applying the film to the adhesive substance.

4. The process of claim 3 wherein said adhesive substance comprises a thin film having adhesive on both surfaces.

5. The process of claim 1 wherein said image-bearing film comprises a thin color film.

6. The process of claim 1 wherein said touches of hardenable pasty mass are applied to the support in accordance with the variations in lighting of said projected image corresponding to the relief portions of the pictorial work.

7. The process of claim 1 wherein said touches of hardenable pasty mass are applied to the support using a tool of the same type used for making the pictorial work.

8. The process of claim 1 wherein said pictorial work is a painting and wherein said touches of hardenable pasty mass are applied to the support to imitate the shape and strokes of the relief portions of the pictorial work.

9. The process of claim 1 wherein said support is of the same substrate material as the substrate of the pictorial work.

10. The process of claim 1 wherein said support and said flat copy are of substantially the same size as the pictorial work.

11. A product obtained by the process of claim 1, said product having hardened imitation relief portions on a support corresponding to the relief portions of the pictorial work, the flat copy of said work being adhered to the support so that the relief portions of the pictorial work shown in the flat copy coincide faithfully to the relief portions of the support.

12. A process for reproducing a pictorial work such as a painting on a support, comprising:

producing a photograph of said pictorial work having an image-bearing film mounted on a support;

projecting an image of said photograph onto a plane substrate of material corresponding to the substrate material of said pictorial work;

applying touches of a hardenable paste on part of said substrate to construct imitation relief portions coinciding with relief portions of the pictorial work shown in said image, said touches being applied with a tool of the same type used for making the pictorial work by imitating the shape of the relief portions of the pictorial work;

allowing the touches of paste to harden on said substrate;

removing the image-bearing film from the support of said photograph;

applying said image-bearing film to said substrate so that the relief portions of the pictorial work shown on the image-bearing film are aligned with the imitation relief portions on the substrate; and compressing the image-bearing film onto the substrate to mold the film into the substrate so that the imitated relief portions and the structure of the substrate appear through the image-bearing film.

* * * * *

UNITED STATES PATENT AND TRADEMARK OFFICE
CERTIFICATE OF CORRECTION

PATENT NO. : 4,203,789

DATED : May 20, 1980

INVENTOR(S) : Gerard L. Y. Delorme

It is certified that error appears in the above—identified patent and that said Letters Patent are hereby corrected as shown below:

Column 2, line 33, "genreally" should be —generally—

Column 3, line 1, "saif" should be —said—

Column 3, line 25, "Claim 1" should be —Claim 2—

Signed and Sealed this

Twenty-second Day of December 1981

|SEAL|

Attest:

Attesting Officer

GERALD J. MOSSINGHOFF

Commissioner of Patents and Trademarks